(12) United States Patent
Hudson, Jr. et al.

(10) Patent No.: US 11,403,435 B2
(45) Date of Patent: Aug. 2, 2022

(54) VISUAL FLOOR PLAN SEARCHING

(71) Applicant: Portfolio Home Plans, LLC, Prattville, AL (US)

(72) Inventors: Fred L Hudson, Jr., Prattville, AL (US); Christopher M. Locke, Boca Raton, FL (US)

(73) Assignee: Portfolio Home Plans, LLC, Prattville, AL (US)

( * ) Notice: Subject to any disclaimer, the term of this patent is extended or adjusted under 35 U.S.C. 154(b) by 214 days.

(21) Appl. No.: 16/720,670

(22) Filed: Dec. 19, 2019

(65) Prior Publication Data

US 2021/0042449 A1 Feb. 11, 2021

Related U.S. Application Data

(60) Provisional application No. 62/883,718, filed on Aug. 7, 2019.

(51) Int. Cl.
| | |
|---|---|
| *G06G 7/48* | (2006.01) |
| *G06F 30/12* | (2020.01) |
| *G06F 30/13* | (2020.01) |

(52) U.S. Cl.
CPC .............. *G06F 30/12* (2020.01); *G06F 30/13* (2020.01)

(58) Field of Classification Search
CPC ................................ G06F 30/12; G06F 30/13
See application file for complete search history.

(56) References Cited

U.S. PATENT DOCUMENTS

| | | | | |
|---|---|---|---|---|
| 10,151,599 | B1 * | 12/2018 | Meador | G06F 30/13 |
| 2008/0126022 | A1 * | 5/2008 | Hoguet | G06F 30/13 |
| | | | | 703/1 |
| 2014/0095122 | A1 * | 4/2014 | Appleman | G06F 30/13 |
| | | | | 703/1 |
| 2014/0172731 | A1 * | 6/2014 | Ericksen | G06Q 10/105 |
| | | | | 705/320 |
| 2016/0077185 | A1 * | 3/2016 | Marshall | G01S 5/0273 |
| | | | | 455/456.6 |
| 2017/0091885 | A1 * | 3/2017 | Randolph | G06F 3/167 |
| 2020/0320229 | A1 * | 10/2020 | Andersson | G06F 30/12 |

* cited by examiner

*Primary Examiner* — Rehana Perveen
*Assistant Examiner* — Nithya J. Moll
(74) *Attorney, Agent, or Firm* — Coats + Bennett, PLLC

(57) ABSTRACT

A computing device for searching floor plans selects a floor plan from a plurality of floor plans based on where different types of room objects are positioned by a user within an interactive workspace and how many of each different type of room object is included by the user within the interactive workspace, and outputs the floor plan to an output interface of the computing device.

19 Claims, 11 Drawing Sheets

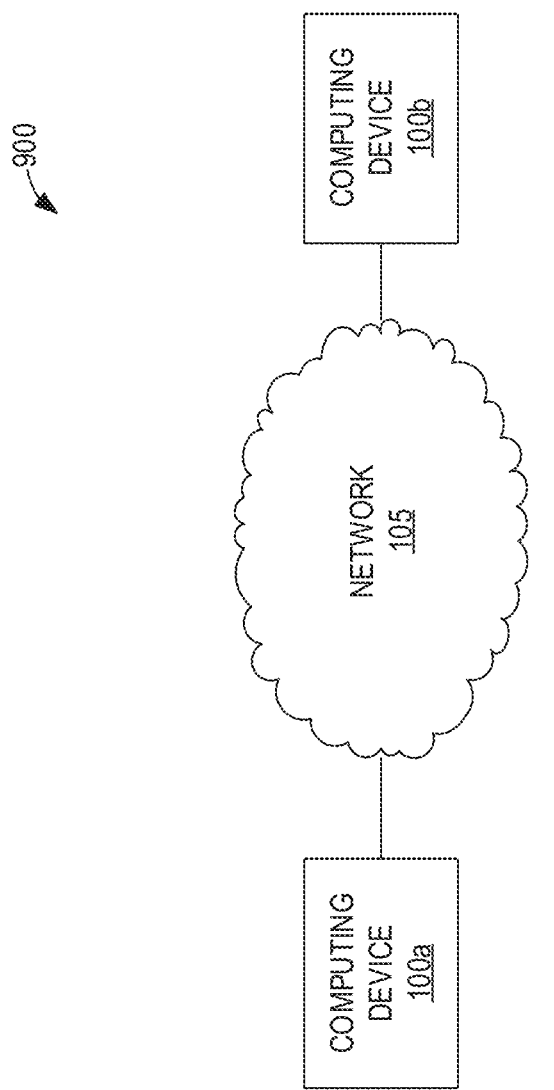

VISUAL FLOOR PLAN SEARCHING

RELATED APPLICATIONS

This application claims the benefit of U.S. Provisional Application No. 62/883,718, filed 7 Aug. 2019, the entire disclosure of which is being hereby incorporated by reference herein.

BACKGROUND

It is common for a person in need of a home plan to already know what they want. In fact, many times the person can already visualize what they want in their mind's eye. Traditionally, when a person performs a search for floor plans using the Internet, that person is limited to performing typical database queries. For example, the person may specify the number of bedrooms, number of bathrooms, square footage, and so on. Ultimately, this only creates a long list of plans that the person must comb through manually in order to locate what they want in an overall layout, placement of particular rooms, and other factors. This can become overwhelming because searching according to these criteria can match a vast number of plans without aligning with what the person actually desires in a plan.

SUMMARY

The present disclosure relates to searching for floor plans, and more particularly to effectively locating a floor plan of interest by using a user interface to specify desired plan elements such as room placement and layout.

Particular embodiments of the present disclosure provide a visual plan search application executing on a computing device. The application provides a user interface to a user, and receives input specifying placement of one or more rooms. The application filters a database of plans in accordance with the placement of the rooms. By enabling the user to find plans that match their desired room placement and/or layout, embodiments of the present disclosure make locating a desirable plan easier for the user than traditional approaches.

In some such embodiments, the user drags an icon that represents a room to a desired location within a layout area provided in a user interface, and the application filters plans based on the location of the room placed. In some embodiments, the user drags multiple icons into the user interface and the application filters plans based on the locations of the rooms placed and the relationship of those rooms to each other (i.e., the layout of the rooms).

Particular embodiments of the present disclosure include a method of searching floor plans implemented by a computing device. The method comprises selecting a floor plan from a plurality of floor plans based on where different types of room objects are positioned by a user within an interactive workspace and how many of each different type of room object is included by the user within the interactive workspace. The method further comprises outputting the floor plan to an output interface of the computing device.

In some embodiments, selecting the floor plan based on how many of each different type of room object is included by the user comprises filtering the plurality of floor plans to exclude floor plans that lack, for each of the different types of room objects, a same number of rooms of a corresponding type.

In some embodiments, the method further comprises selecting the floor plan based on where the different types of room objects are positioned comprises selecting the floor plan based on a relative position of each of the room objects to each of the other room objects.

In some embodiments, the method further comprises mapping where the different types of room objects are positioned by the user within the interactive workspace to respective first positions of a grid. The method further comprises mapping rooms of the floor plan to respective second positions of the grid. Further, selecting the floor plan comprises selecting the floor plan based on a correspondence between at least one first position and at least one second position.

In some such embodiments, selecting the floor plan based on the correspondence between the at least one first position and the at least one second position comprises selecting the floor plan based on each at least one first position being collocated with at least one second position mapped to a room of the floor plan of the same type as the room object mapped to the first position. In at least one such embodiments, selecting the floor plan based on each at least one first position being collocated with at least one second position comprises determining that each at least one first position is the same as at least one second position.

In some such embodiments, mapping the rooms of the floor plan to respective second positions of the grid comprises mapping a type of each room to coordinates of the grid, the method further comprising storing the mapping as a metadata representation of the floor plan in a floor plan database.

In some such embodiments selecting the floor plan is responsive to updating the mappings using progressively more coarse grids until the correspondence between the at least one first position and the at least one second position is detected using the grid. Further, outputting the floor plan to the output interface of the computing device comprises adding the floor plan to a list of search results provided to the user.

In some such embodiments, the method further comprises, responsive to selecting and outputting the floor plan, updating the mappings using a finer grid than the grid such that the correspondence between the at least one first position and the at least one second position is lost. The method further comprises filtering the floor plan from a list of search results provided to the user responsive to the correspondence being lost.

Other embodiments include a computing device comprising interface circuitry and processing circuitry communicatively connected to the interface circuitry. The processing circuitry is configured to select a floor plan from a plurality of floor plans based on where different types of room objects are positioned by a user within an interactive workspace and how many of each different type of room object is included by the user within the interactive workspace. The processing circuitry is further configured to output the floor plan via the interface circuitry.

In some embodiments, to select the floor plan based on how many of each different type of room object is included by the user, the processing circuitry is configured to filter the plurality of floor plans to exclude floor plans that lack, for each of the different types of room objects, a same number of rooms of a corresponding type.

In some embodiments, to select the floor plan based on where the different types of room objects are positioned, the processing circuitry is configured to select the floor plan based on a relative position of each of the room objects to each of the other room objects.

In some embodiments, the processing circuitry is further configured to map where the different types of room objects are positioned by the user within the interactive workspace to respective first positions of a grid, and map rooms of the floor plan to respective second positions of the grid. To select the floor plan, the processing circuitry is configured to select the floor plan based on a correspondence between at least one first position and at least one second position.

In some such embodiments, to select the floor plan based on the correspondence between the at least one first position and the at least one second position, the processing circuitry is configured to select the floor plan based on each at least one first position being collocated with at least one second position mapped to a room of the floor plan of the same type as the room object mapped to the first position. In at least one such embodiment, to select the floor plan based on each at least one first position being collocated with at least one second position, the processing circuitry is configured to determine that each at least one first position is the same as at least one second position.

In some such embodiments, to map the rooms of the floor plan to respective second positions of the grid, the processing circuitry is configured to map a type of each room to coordinates of the grid. The processing circuitry is further configured to store the mapping as a metadata representation of the floor plan in a floor plan database.

In some such embodiments, the processing circuitry is configured to select the floor plan responsive to updating the mappings using progressively more coarse grids until the correspondence between the at least one first position and the at least one second position is detected using the grid. To output the floor plan via the interface circuitry, the processing circuitry is configured to add the floor plan to a list of search results provided to the user.

In some such embodiments, the processing circuitry is further configured to, responsive to selecting and outputting the floor plan, update the mappings using a finer grid than the grid such that the correspondence between the at least one first position and the at least one second position is lost. The processing circuitry is further configured to filter the floor plan from a list of search results provided to the user responsive to the correspondence being lost.

Other embodiments include a non-transitory computer readable medium storing software instructions for controlling a programmable computing device. The software instructions, when run on the programmable computing device, cause the programmable computing device to select a floor plan from a plurality of floor plans based on where different types of room objects are positioned by a user within an interactive workspace and how many of each different type of room object is included by the user within the interactive workspace, and to output the floor plan to an output interface of the computing device.

Of course, those skilled in the art will appreciate that the present embodiments are not limited to the above contexts or examples, and will recognize additional features and advantages upon reading the following detailed description and upon viewing the accompanying drawings.

BRIEF DESCRIPTION OF THE DRAWINGS

Aspects of the present disclosure are illustrated by way of example and are not limited by the accompanying figures with like references indicating like elements. In general, the use of a reference numeral should be regarded as referring to the depicted subject matter according to one or more embodiments, whereas discussion of a specific instance of an illustrated element will append a letter designation thereto.

FIG. 11 is a schematic block diagram of an example network environment, according to one or more embodiments of the present disclosure.

DETAILED DESCRIPTION

Various embodiments of the present disclosure enable a user to create a floor plan that represents a desired floor plan, in whole or in part, and will locate a matching plan from a floor plan database. Among other things, such embodiments may enable a user to locate the home of their dreams by specifying their dream home layout room by room. Such embodiments may facilitate a user locating a plan as part of the home buying and/or building process.

Figure 1:
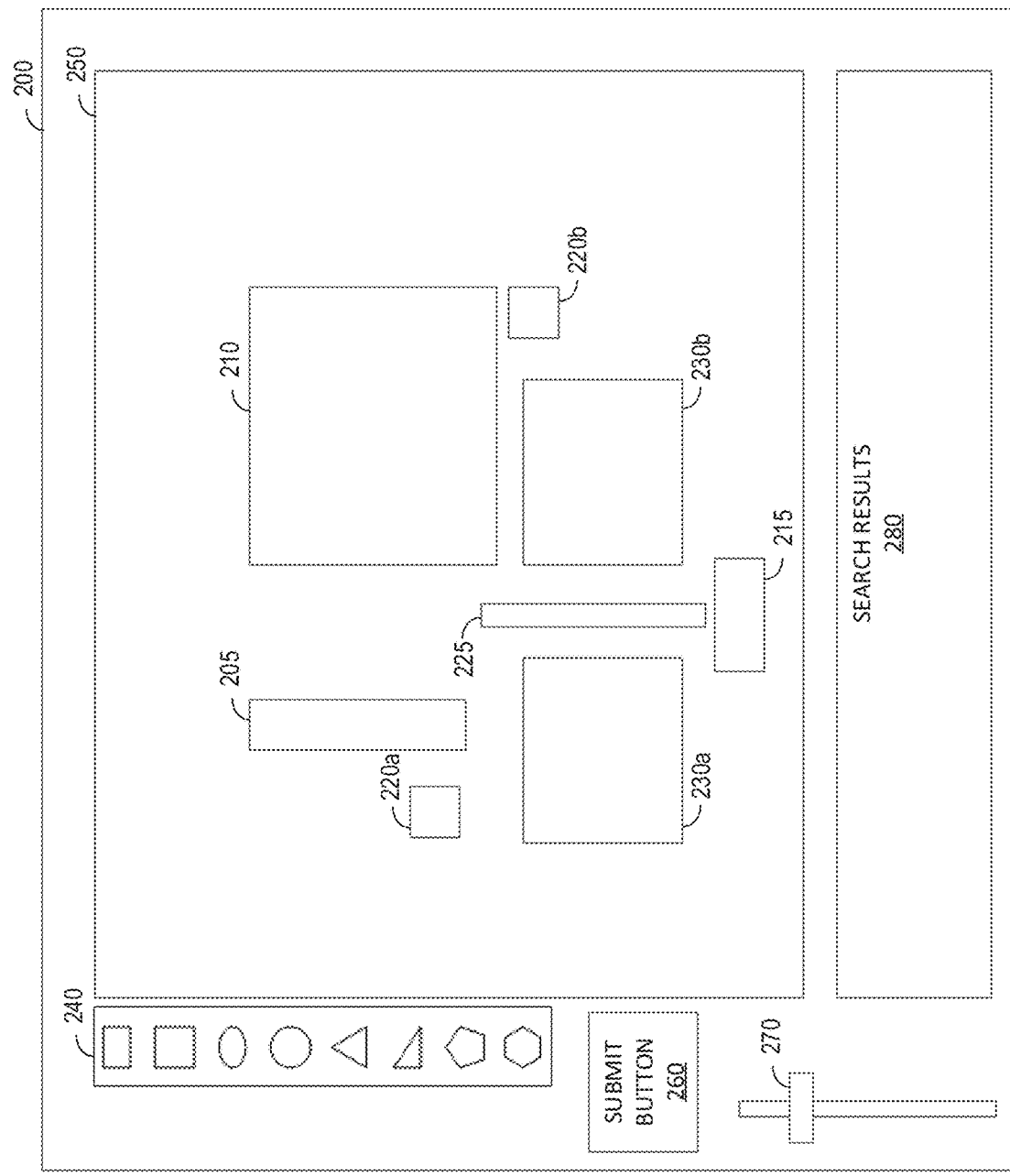
FIGS. 1-3 are schematic diagrams illustrating example user interfaces for searching floor plans, according to one or more embodiments of the present disclosure.

FIG. 1 is a schematic block diagram illustrating an example user interface, according to one or more embodiments of the present disclosure. According to embodiments, the user interface is presented to a user via a display of a computing device.

The user interface comprises an interactive workspace 250, a toolbar 240, a submit button 260, a slider 270, and a search results area 280. The toolbar 240 comprises widgets that a user may use in order to add a corresponding room object to the workspace 250. For example, the user may drag and drop an icon from the toolbar 240 to the workspace 250 to add a room object. Alternatively, the user may click or tap an icon in the toolbar 240 and then click or tap a location in the workspace to add a room object. In this example, each icon represents a different type of room object. For example, the rectangle icon may represent a bedroom object 230, whereas the oval icon may represent kitchen object 205. In some embodiments, the workspace 250 provides a grid system (not shown) in which the room objects can be plotted and/or aligned.

The toolbar 240 and icons (including their shapes) as shown in FIG. 1 are merely for purposes of illustration. Any suitable user interface widget(s) may be provided to the user to enable the user to add room objects to the workspace. For example, the room objects may be available for plotting into the workspace 250 via a predefined searchable list (not shown) by name with matching icons representing the average size of each room they are intended to represent. As can be seen in the example workspace 250 of FIG. 1, different room objects have different representative shapes and sizes that generally reflect sizes and shapes of their corresponding rooms. In some embodiments, these sizes and shapes are merely representative of the type of room object, and do not directly impart constraints on any search performed by the user.

The example workspace 250 illustrated in FIG. 1 includes six types of room objects, and eight room objects in total. The room objects in this example include one kitchen type object 205, one living room type object 210, one foyer type object 215, two bathroom type objects 220a, 220b, one hallway type object 225, and two bedroom type objects 230a, 230b. In this example, hallway type object 225 has a long and narrow shape, which generally represents the shape and size that hallways typically have. Similarly, the living room type object 210 is larger than the bedroom type objects 230a, 230b, which are larger than the bathroom type objects 220a, 220b.

Note that the workspace 250 of FIG. 1 illustrates merely one example of the number, types, and placement of room objects. Other embodiments may include fewer or additional room objects and/or fewer or additional room object types. Such embodiments may additionally or alternatively include room object types and/or room objects that are different from those discussed herein. For example, other embodiments may include objects for things that are not rooms, like doors, windows, fireplaces, porches, driveways, and other features.

Further, embodiments of the present disclosure may arrange included room objects in other ways, including (in some embodiments) in ways that overlap each other, among other things. Indeed, elements within the workspace 250 may be moved within or deleted from the workspace 250 as necessary.

The number, type, and arrangement of the room objects generally represent criteria that the user has for locating an appropriate floor plan. In this example, the user has specified that they are interested in locating a plan in which, upon entering the first floor of a home, one bedroom is located on each side of a hallway connecting the foyer to the opposite side of the home where a kitchen will be found on the left, and a living room will be found on the right. The user has also specified that a first bathroom should be behind the kitchen, and another bathroom should be separated from the hallway by one of the bedrooms. Although the example of FIG. 1 illustrates a plan having a single floor, other embodiments provide a user interface 200 having controls that allow a user to specify a plan for any number of floors, each of which may be associated with objects placed by the user. Corresponding controls may be provided to allow the user to navigate between the floors, with the workspace 250 updating accordingly.

Figure 2:
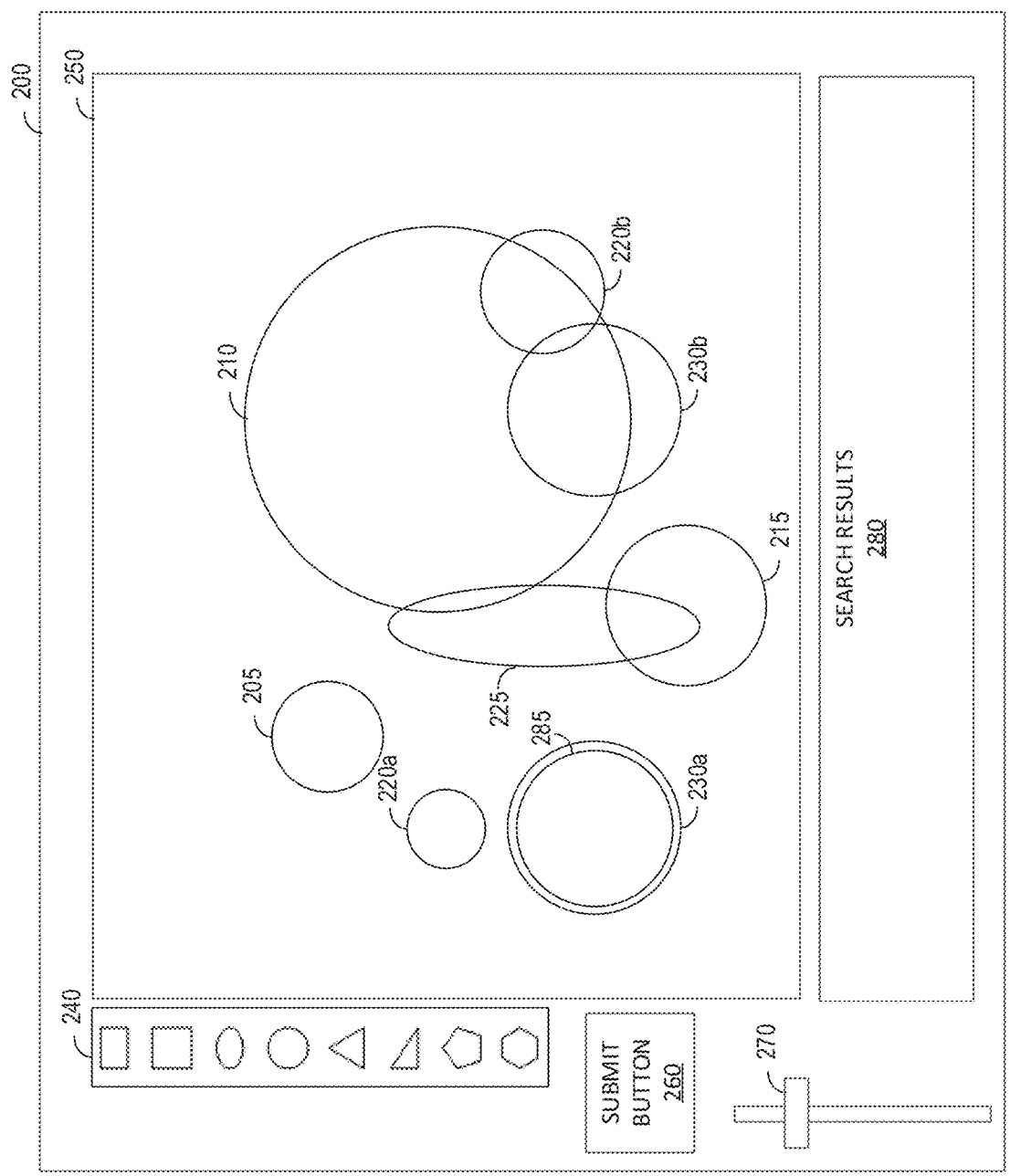

The representation of the room objects in the user interface 200 may differ, according to various embodiments. FIG. 2, for example, also illustrates an example workspace 250 that includes one kitchen type object 205, one living room type object 210, one foyer type object 215, two bathroom type objects 220a, 220b, one hallway type object 225, and two bedroom type objects 230a, 230b. In contrast to the example of FIG. 1 however, the example of FIG. 2 uses round objects (e.g., circles, ovals) to represent a desired position of respective rooms. Regardless of the shape used, according to embodiments, the boundaries of the shape may designate an area in which the user prefers the corresponding room to be located. In some particular embodiments, the center represents an ideal placement, with less preferred (yet nonetheless still acceptable) placements emanating away from the center up to the shape border, where the least preferable locations are positioned. Other embodiments may treat any location within the shape boundary as equally preferred.

The example of FIG. 2 also differs from the example of FIG. 1 in that it uses stacked room objects to specify that any of a plurality of rooms may be satisfactory to the user within the corresponding area and/or that a multi-function room is desired. In this particular example, the user has stacked bedroom type object 230a with an office type object 285 to indicate that either a bedroom or an office is desired within the circular area of the two. Although this example shows an example of stacking two room objects, any number of room objects may be stacked to specify that any of the rooms of their respective types may be acceptable to the user.

Figure 3:
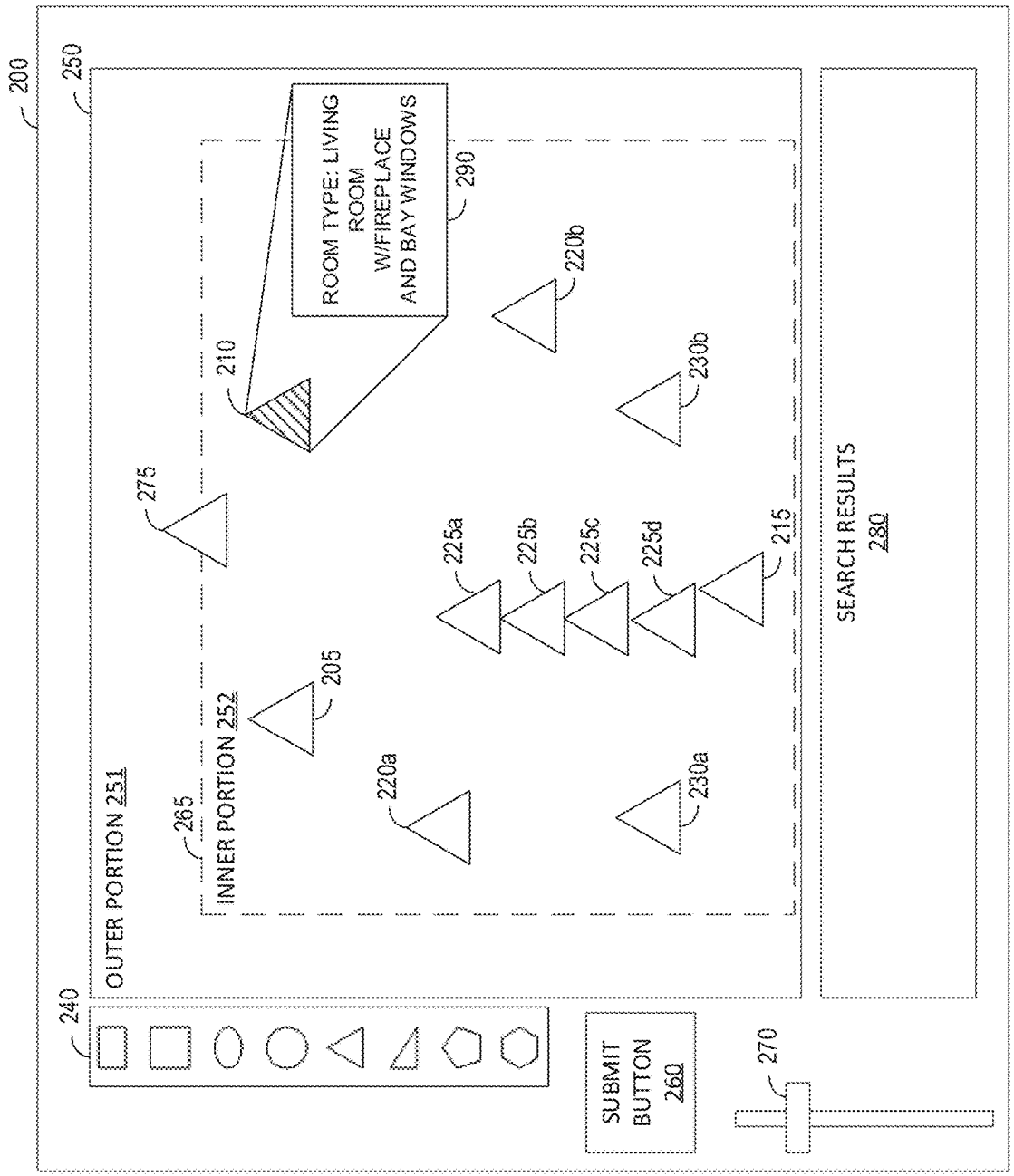

FIG. 3 illustrates another example workspace 250 that includes one kitchen type object 205, one living room type object 210, one foyer type object 215, two bathroom type objects 220a, 220b, one hallway type object 225, and two bedroom type objects 230a, 230b. In contrast to the examples of FIGS. 1 and 2 however, the example of FIG. 3 uses simple triangles to represent room objects at a single position within the workspace 250. According to such embodiments, locations farther away from where the room objects are positioned are presumed to be less preferable. In this particular example, the user is able to select a room object to obtain more information about that room object. As shown in this example, the living room object 210 is selected by the user, which causes a callout box 290 to be displayed. The callout box 290 displays information about the selected room object.

Also in contrast to the examples of FIGS. 1 and 2, the example of FIG. 3 uses multiple room objects to indicate a general shape of the desired corresponding room. More specifically, FIG. 3 reflects that the user would like a long hallway using four adjacent hallway type room objects 225a-d. In such an embodiment, the computing device may (for example) satisfy the user's criteria by returning a plan having a single hallway that includes the locations designated by the hallway type room objects 225a-d.

FIG. 3 also includes a boundary 265 within the workspace 250 that divides the workspace into an inner portion 252 and an outer portion 251. In this example, room objects representing finished interior rooms are restricted to placement within the inner portion 252, whereas objects that represent exterior elements or unfinished interior rooms may be placed in either the inner portion 252 or the outer portion 251. In this particular example, the workspace includes a porch type object 275. Because the porch type object 275 represents an exterior element, it is permitted to be placed entirely or partially within the outer portion 252. In this example, the porch type object 275 is partially in the inner portion 252 and partially within the outer portion 251. Although certain features are only illustrated in one of FIGS. 1-3, similar functionality can be provided by using the features illustrated in any of FIGS. 1-3 in any other of the FIGS. 1-3. For example, the boxes of FIG. 1, may be combined with the ovals of FIG. 2, the boundary 265 of FIG. 3, and the room stacking of FIG. 2. Other embodiments include other such combinations of features, as may be suitable for the particular application or situation in which they will be used.

Once the room objects have been positioned, the user may initiate the search for one or more matching floor plans. In the examples of FIGS. 1-3, the user initiates the search by clicking or tapping on the submit button 260. According to other embodiments, search results are updated and presented in a search results area 280 as the user interacts with and modifies the contents of the workspace 250, thereby giving the user feedback e.g., with regard to the total number of matching plans and/or whether individual layout elements (e.g., room objects) have matching results.

The search results area 280 may provide a count that represents all floor plans that match the criteria provided by the user. In some embodiments, the search may be broadened or tightened depending on a user refinement setting and plan mirror options. That is, a user configurable refinement setting my specify how closely a floor plan must comply with the requirements specified by the user in order to be deemed a match, and a user configurable plan mirror option may indicate whether the user would like to also search based on a mirror image of the indicated search criteria. Correspondingly, in some embodiments, result counts may be broken down by plans and mirrored plans respectively.

Particular embodiments may provide widgets for refining or expanding the search results. Some such embodiments, for example, use a slider 270 that controls the refinement setting. In this way, refining results may match the locations of the user's provided elements more exactly, or conversely may expand the results by loosening the matching algorithm. In some embodiments, the refinement setting may be stepped granularly in either direction, producing additional or fewer search results with each step.

Other embodiments additionally or alternatively allow a user to specify additional filters, e.g., to filter out all plans meeting or not meeting a given criteria). For example, after an initial set of search results are obtained and presented to the user, the user may be provided with user interface elements to filter plans based on architectural style (e.g., colonial, farmhouse, contemporary), exterior features (e.g., brick, shingled), car features (e.g., 2 car garage, side-by-side driveway), kitchen features (e.g., dual ovens, island), bathroom features (e.g., garden tub, frameless glass shower), square footage, and/or structural features (e.g., slab, crawlspace).

The full search result listings from a search may identify the resulting plans sorted by best layout matches, where the number of element matches and precision of locations may be calculated together to rank and sequentially sort each match. User layout diagrams can be saved by users who have logged into their account for future visits & searches.

Figure 4:
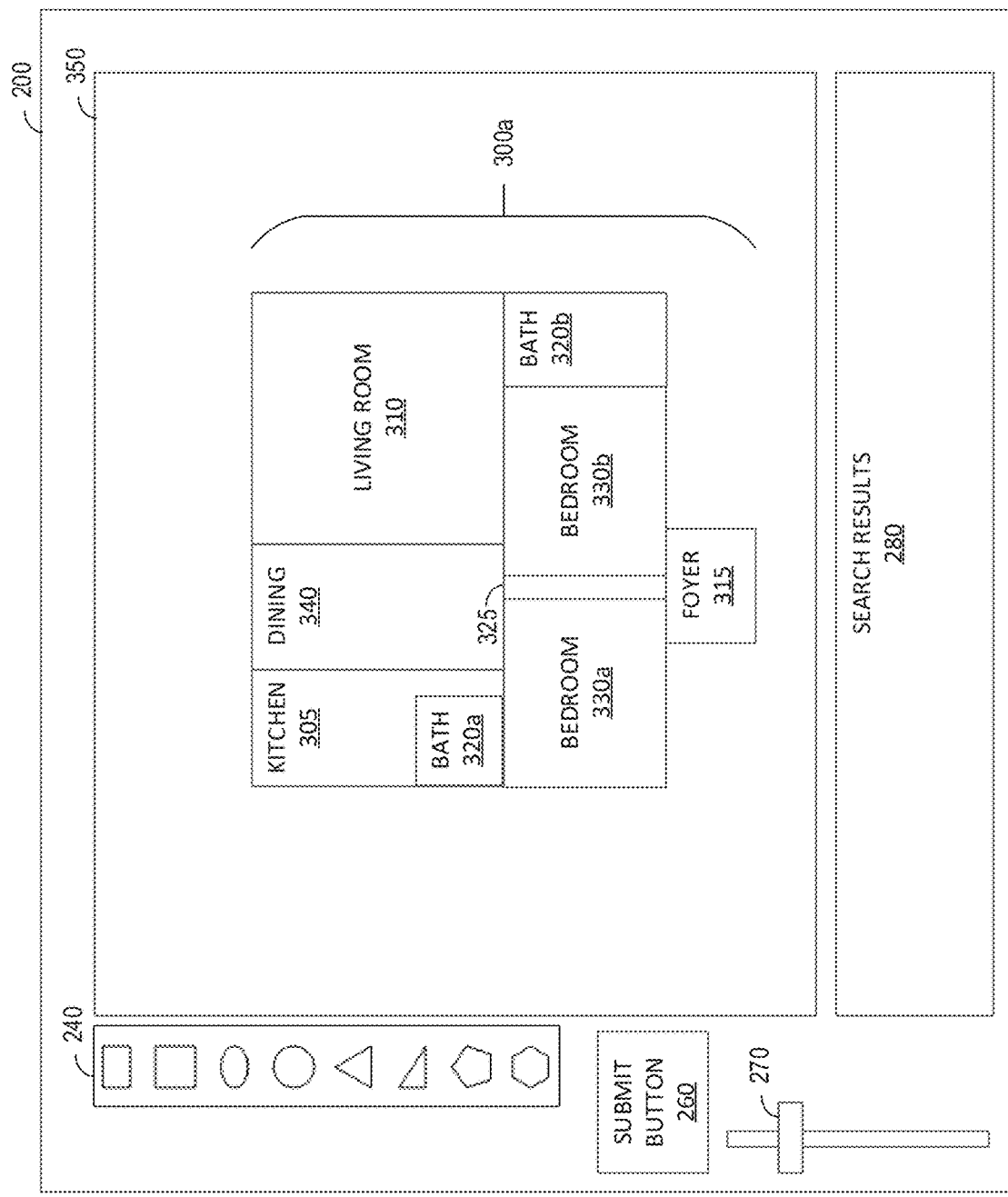
FIG. 4 is a schematic diagram illustrating an example user interface for viewing a floor plan, according to one or more embodiments of the present disclosure.

FIG. 4 illustrates an example plan 300*a* returned as a result of the search. In this example, the user interface 200 is updated to replace the workspace 250 with a plan view 350 showing a plurality of rooms. Consistent with the room objects positioned into the workspace 250 by the user, the plan view 350 includes a plan 300*a* comprising one kitchen 305, one living room 310, one foyer 315, two bathrooms 320*a*, 320*b*, one hallway 325, and two bedrooms 330*a*, 330*b*.

It should be noted that although the plan bears many similarities to the number of room objects, types of room objects, and arrangement of room objects created by the user in the workspace 250, as shown in FIGS. 1-3, the plan differs in many respects. For example, the plan in FIG. 4 includes a dining room 340 that was not represented in the workspace 250 of FIGS. 1-3. Further, the rooms in the plan 300*a* are not limited to the shapes shown in the workspace 250 of the previous examples. For example, the plan 200 of FIG. 4 includes a kitchen that is not only wider than the kitchen type room object 205 shown in FIG. 1 (for example), but is also of a different shape. The bathrooms 320*a*, 320*b* are also of different sizes and shapes than their corresponding bathroom objects 220*a*, 220*b* in FIGS. 1-3. Indeed, the actual plan 300 selected and returned for presentation to the user may differ significantly from what the user provided, e.g., depending on the plans that are available to the system (e.g., stored in an available plan database). That said, plans that are largely consistent with the user's preferences are generally considered to be advantageous in many embodiments.

Different users may be presented with different user interfaces. For example, a user interface 200 may enable users interested in searching for a floor plan to select each floorplan level and provide an appropriate representation of their requirements (e.g., as exemplified in FIGS. 1-3). Additionally or alternatively, a user interface 200 may enable users to create a floor plan (e.g., such as the plan 300*a* shown in FIG. 4) that other users can search for.

Figure 5:
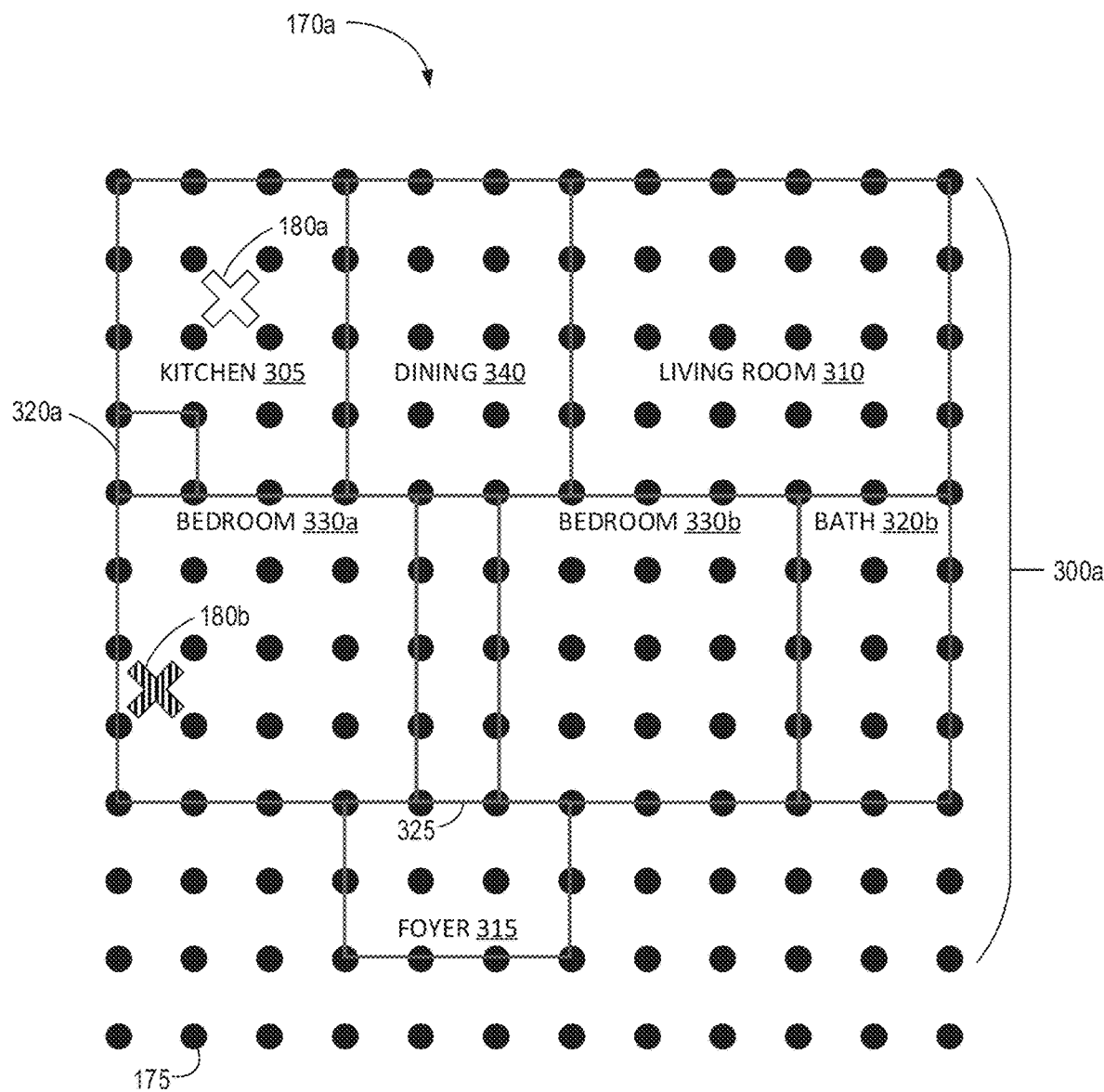
FIGS. 5 and 6 are schematic block diagrams of grids onto which different plans have been mapped, according to embodiments of the present disclosure.

To create a floor plan, a user may be presented with a user interface 200 having a layout plotting grid 170*a*, as shown in the example of FIG. 5. The example of FIG. 5 includes a twelve-by-twelve grid 170*a* of points 175 onto which the example plan 300*a* has been plotted. In particular, FIG. 5 includes bounded areas corresponding to the kitchen 305, living room 310, foyer 315, bathrooms 320*a*, 320*b*, hallway 325, and bedrooms 330*a*, 330*b* of the plan 300. The area outside of the bounded areas may correspond to an outdoor area such as a front yard.

The user interface 200 may further enable the user to select each floor plan level and an appropriate representative floorplan image, resizing the floorplan image to best fit the grid system. Different floor plan elements/rooms may be available for plotting in a predefined searchable list by name with matching icons representing the average size of each, for example.

The user may select one or more elements and/or room types from the list and place them on the grid 170 to plot the elements and/or room types within the plan 300. Plotted elements can be moved within or deleted from a layout as necessary, adjusting the plotted element geometry and grid system coordinates accordingly. For each floorplan element and/or room, geometry and grid system coordinates may be plotted by calculations based on the floorplan, the size of the element, and the overlay grid system. The information provided by the user and/or calculated by the computing device may be stored in a floor plan database (e.g., a relational database).

In some embodiments, each level of the floorplan has its own layout and elements plotted, with each level layout being grouped together and stored in the database as the dataset for each floorplan, consisting of layout & element geometry, and grid coordinates for each.

In some embodiments, the user may specify that they would like to make a mirrored plan option available. In such embodiments, pseudo elements and/or rooms may be automatically generated and also stored in the floor plan database (e.g., as a separate plan, or in association with the original). Thus, the mirrored option may be generated out of the view of the user (e.g., on the backend) such that the mirrored option has, for each of the plotted elements/rooms, a mirrored copy of the floorplan layout.

To find a plan 300 (e.g., plan 300*a* of FIG. 4) that matches search criteria as provided by the user (e.g., as shown in FIGS. 1-3), one or more room objects reflecting the user's search criteria may be mapped to the grid 170 to identify whether the one or more room objects provided by the user correlate to one or more of the rooms of one or more plans 300 stored in a plan database.

In the example of FIG. 5, location 180*a* corresponds to a kitchen object 205 provided by the user, whereas location 180*b* corresponds to a bedroom object 230 provided by the user. In particular, locations 180*a*, 180*b* may correspond to the centers of kitchen object 205 and bedroom object 230, respectively, shown in the example of FIG. 2. Accordingly, plan 300*a* may be returned as a search result responsive to locations 180*a*, 180*b* being within kitchen 305 and bedroom 330*a*, respectively, as shown in FIG. 5.

Figure 6:
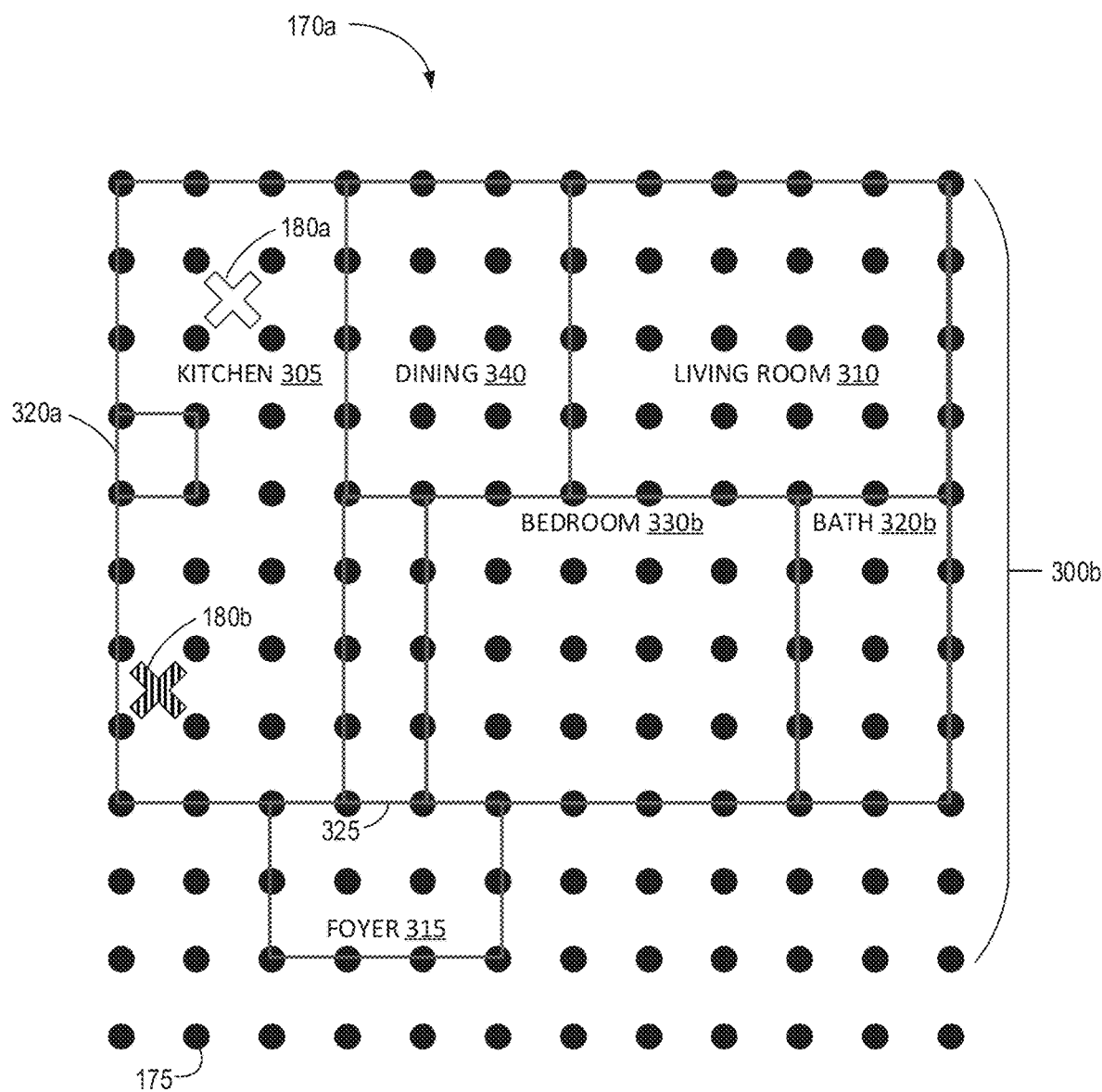

In some embodiments, one or more locations 180 corresponding to room objects of a given type may not match a room of that same type in a given plan 300. FIG. 6 illustrates an example plan 300*b* that is similar to plan 300*a*, except that plan 300*b* does not include bedroom 330*a*. Instead, the plan 300*b* of FIG. 6 comprises an extended kitchen 305 occupying most of the corresponding grid 170*a* space occupied by bedroom 330*a* in plan 300*a*. Accordingly, location 180*b*, which corresponds to bedroom object 230 input by the user, is not comprised within any bedroom 330 of plan 300*b*. Notwithstanding, location 180*a* corresponding to kitchen object 205 continues to fall within a kitchen 305.

Because plan 300*b* matches at least one search criteria provided by the user, the plan 300*b* may also be returned as a search result (i.e., in addition to plan 300*a*), in some embodiments. In particular, because plan 300*b* matches fewer search criteria than plan 300*a*, when plans 300*a*, 300*b* are presented to the user (e.g., in a search result area 280 of a user interface 200), plan 300*b* may be ranked lower than plan 300*a*, in some embodiments. Accordingly, the relevance of search results may be based on how many rooms match the room objects placed by the user. According to other embodiments, plan 300*b* may be excluded from search results, e.g., because plan 300*b* in inadequately relevant to the user's search criteria.

It should be noted that the rooms of the plan 300 may also be correlated to locations 180 in the grid 170. Indeed, in some embodiments, these correlated locations 180 of plan rooms are compared against the locations correlated from room objects in order to determine whether a plan 300 meets the user's search criteria.

Figure 7:
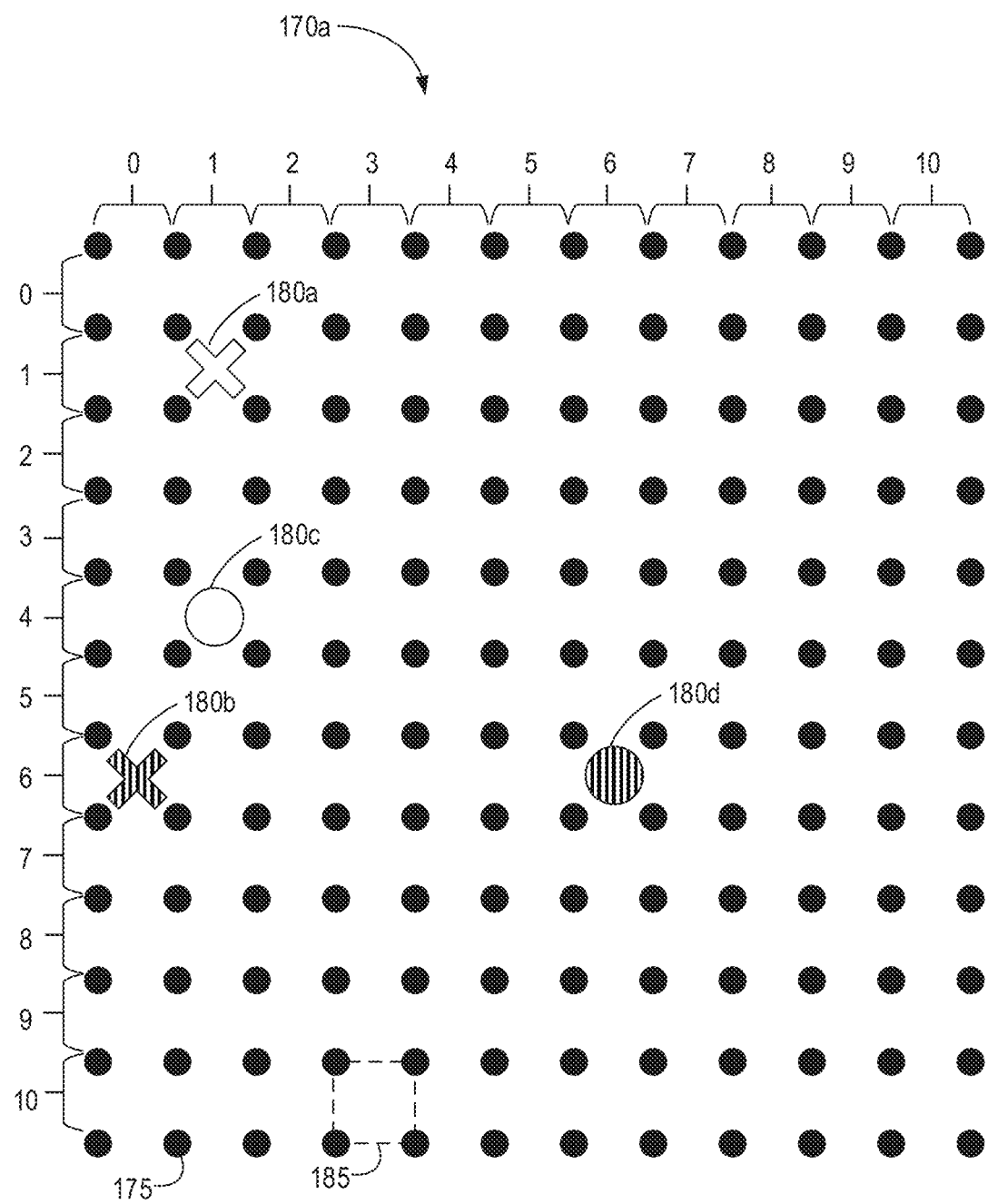
FIGS. 7 and 8 are schematic block diagrams of different grids onto which locations of room objects indicated by a user and rooms of a floor plan have been mapped, according to one or more embodiments of the present disclosure.

FIG. 7 illustrates an example in which the kitchen 305 and bedroom 330*b* of plan 300*b* have been correlated to locations 180*c* and 180*d*, respectively, on the grid 170*a*. Solely for purposes of facilitating explanation, the locations 180*a*, 180*b* corresponding to search criteria specified by the user (e.g., in the form of room object placement) are X-shaped, whereas locations 180*c*, 180*d* corresponding to rooms from the plan 300*b* are circular. Further, locations 180*a* and 180*c* relating to kitchens are unshaded, whereas locations 180*b*, 180*d* relating to bedrooms are shaded.

The locations 180*a*-*d* fall within respective positions 185 of the grid 170*a*, which may be uniquely identified by row and column indices. In this example, the kitchen room object location 180*a* is located at position (1,1), whereas the kitchen plan location 180*c* is located at position (4, 1). Also, the bedroom object location 180*b* is located at position (6, 0), whereas the location 180*d* corresponding to bedroom 330*b* is at position (6, 6). Because none of the room object locations 180*a*, 180*b* provided by the user occupies the same position 185 as locations 180*c*, 180*d* of the same kind of room from plan 300*b*, respectively, plan 300*b* is deemed not to match the user's search criteria in this example.

That said, it should be noted that the amount of area within the grid 170 that each position 185 occupies depends on how tightly packed the points 175 in the grid 170 are. Thus, while the examples of FIGS. 5, 6, and 7 illustrate a twelve-by-twelve grid 170*a* of points 175 (which form eleven rows and eleven columns of positions 185), embodiments of the present disclosure permit the grid 170*a* to be adjusted to use different numbers of points 175 and/or positions 185 of different sizes, e.g., to increase or decrease the precision used when comparing the locations 180 of room objects to the locations 180 of rooms of stored plans 300.

Figure 8:
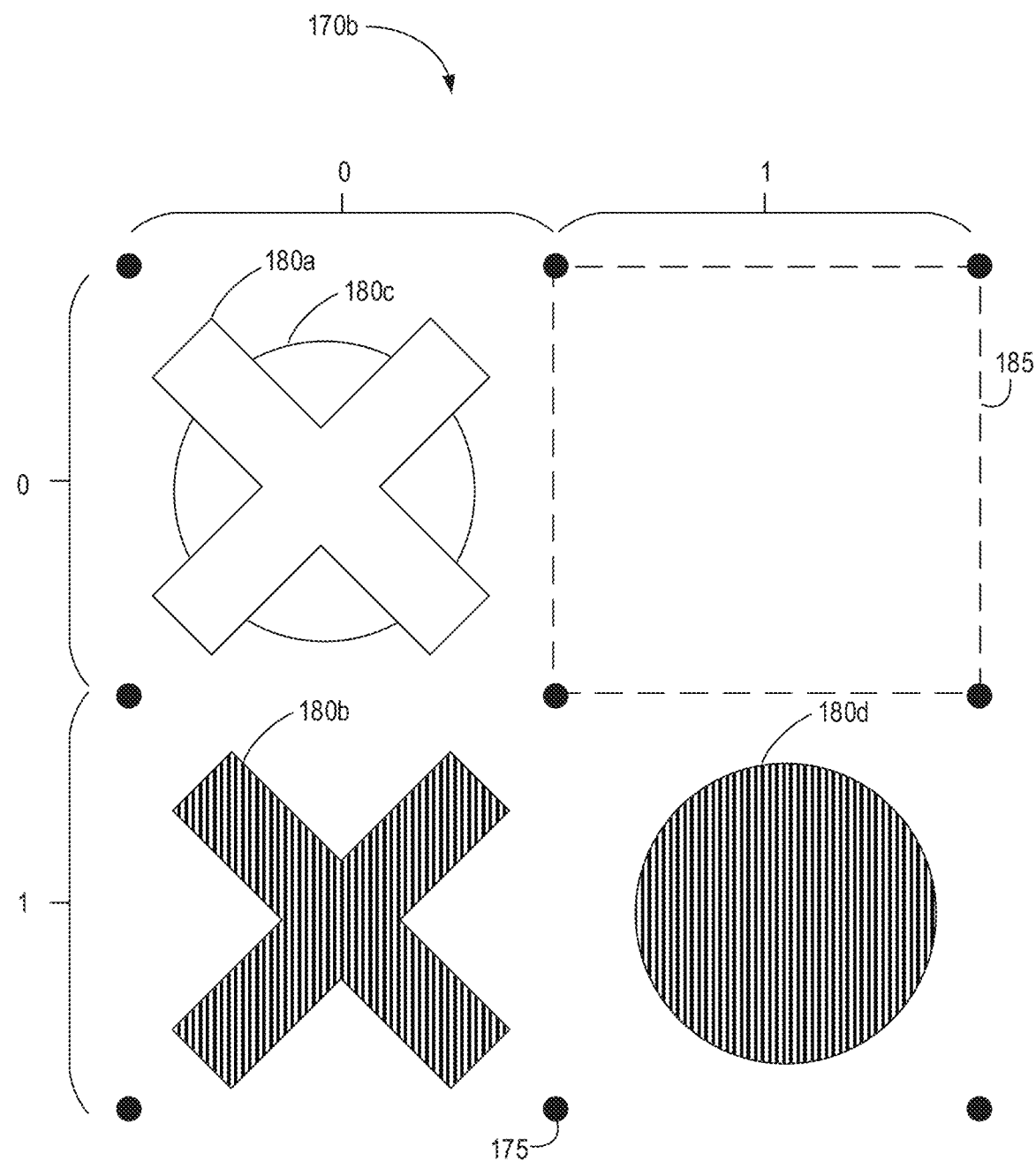

FIG. 8 illustrates an example in which the locations 180*a*-*d* are mapped onto a three-by-three grid 170*b* of points 175 that is more coarse (i.e., less fine) than the twelve-by-twelve grid 170*a* of points 175 illustrated in FIGS. 5-7. Because grid 170*b* is more course than grid 170*a* yet occupies the same total area, the size of each position 185 in grid 170*b* is larger than that of grid 170*a*.

For example, using the more coarse grid 170*b*, locations 180*a* and 180*c* are comprised in the same position (0,0) due to the larger size of the positions 185 of grid 170*b*. Accordingly, using grid 170*b*, plan 300*b* may be deemed to match the user's kitchen criteria (e.g., in contrast to the example grid 170*a* illustrated in FIG. 7 in which the kitchen criteria is not matched).

In particular, the location 180*a* corresponding to the user's desired kitchen placement is in a position (0, 0) where plan 300*b* has a kitchen 305 as represented by location 180*c*. This is in contrast to locations 180*b* and 180*d*, which despite the larger position size of grid 170*b*, remain in different positions therein. More specifically, location 180*b* is at position (1,0), whereas location 180*d* is at position (1,1). Therefore, even though locations 180*b* and 180*d* correspond to rooms of the same type (i.e., a bedroom), locations 180*c* and 180*d* do not match because they are not collocated in the grid 170*b*, according to this example.

In view of the above, in some embodiments, to locate one or more plans 300 based on criteria specified by the user, a computing device may make the grid 170 progressively more coarse until at least a threshold number of plans 300 are determined to match. Correspondingly, in some embodiments, to filter one or more plans 300 from a list of search results, a computing device may make the grid 170 progressively less course (i.e., more fine) until less than a desired threshold number of plans 300 are determined to match. In either of such embodiments, one or both of these thresholds may be specified by the user via the user interface 200.

To efficiently conduct these searches, the positions of a mapped plan 300 may be stored as a metadata representation of the plan 300 in a floor plan database (e.g., as opposed to being computed each time a search is performed). Further, the relevance of a plan 300 to the user's criteria may be based on the number of corresponding matches (e.g., with plans 300 having more matches being deemed more relevant, and ordered in search results provided to the user accordingly).

Figure 9:
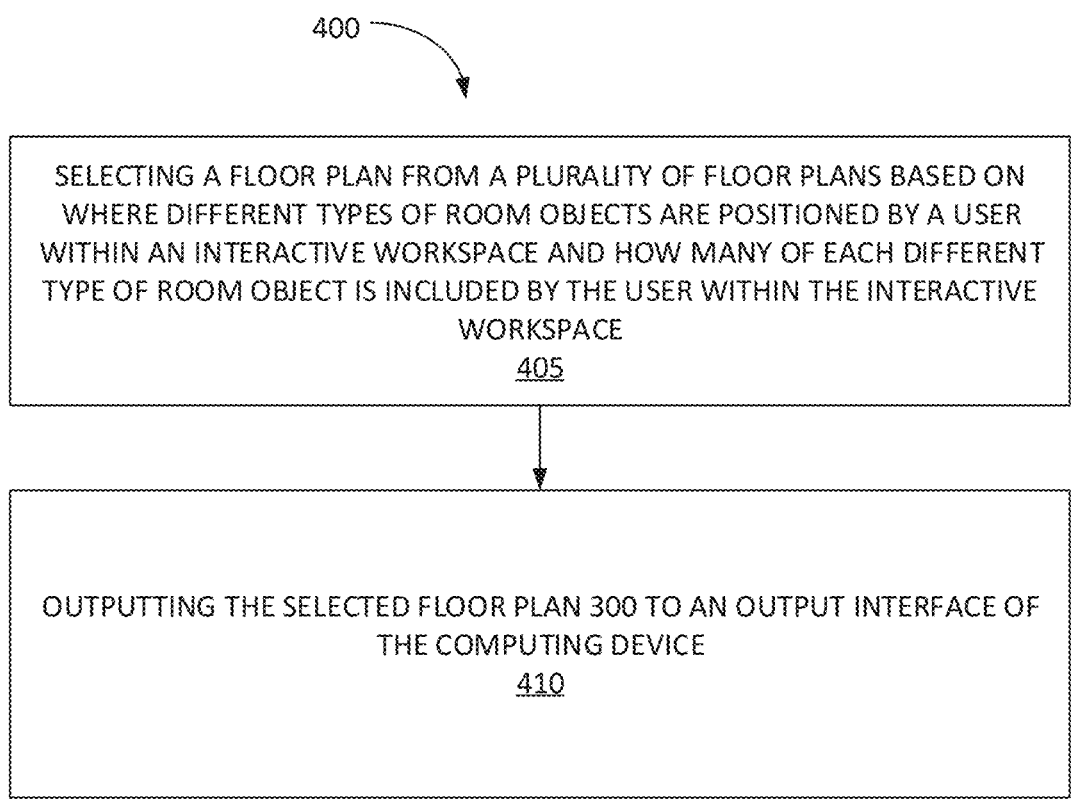
FIG. 9 is a flow diagram of an example method, according to one or more embodiments of the present disclosure.
Figure 10:
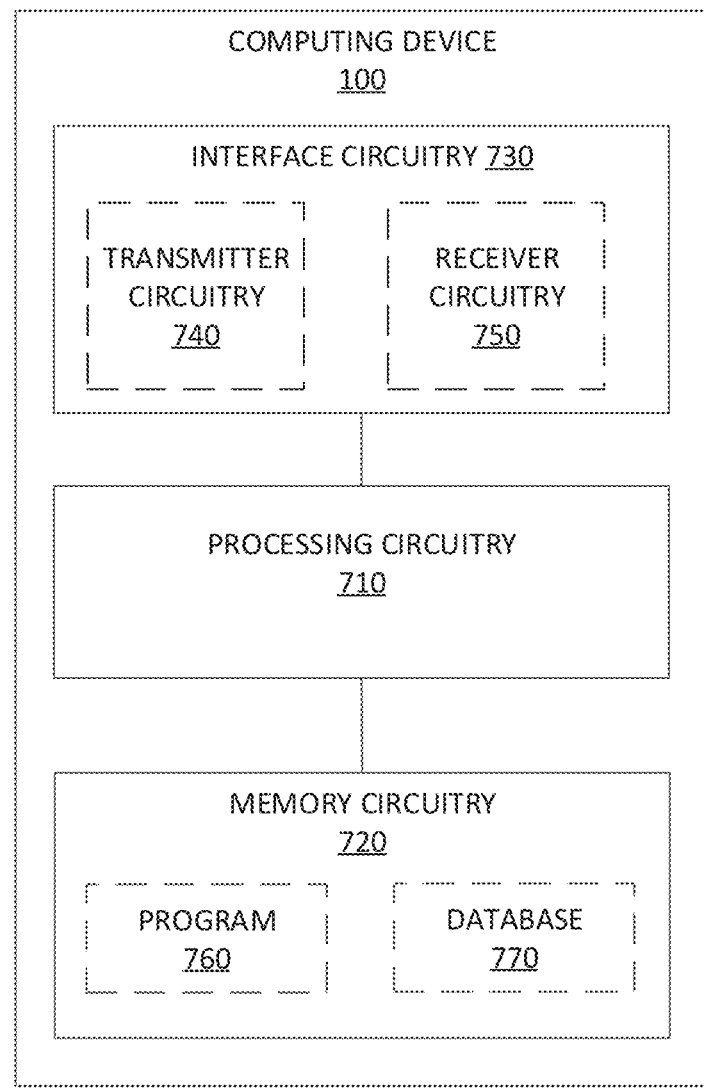
FIG. 10 is a schematic block diagram of an example computing device, according to one or more embodiments of the present disclosure.

In view of the above, and as shown in FIG. 9, embodiments of the present disclosure include a method 400 of searching floor plans implemented by a computing device. The method 400 comprises selecting a floor plan 300 from a plurality of floor plans based on where different types of room objects are positioned by a user within an interactive workspace 250 and how many of each different type of room object is included by the user within the interactive workspace 250 (block 405). The method 400 further comprises outputting the selected floor plan 300 to an output interface of the computing device (e.g., for presentation on a display).

FIG. 6 schematically illustrates an example of a computing device 100, according to one or more embodiments of the present disclosure. For example, the computing device 100 may be configured to perform the method 400 of FIG. 4. The computing device 100 comprises processing circuitry 710, memory circuitry 720, and interface circuitry 730. The processing circuitry 710 is communicatively coupled to the memory circuitry 720 and the interface circuitry 730, e.g., via one or more buses. The processing circuitry 710 may comprise one or more microprocessors, microcontrollers, hardware circuits, discrete logic circuits, hardware registers, digital signal processors (DSPs), field-programmable gate arrays (FPGAs), application-specific integrated circuits (ASICs), or a combination thereof. For example, the processing circuitry 710 may be programmable hardware capable of executing software instructions of a computer program 760 stored in the memory circuitry 720.

The memory circuitry 720 of the various embodiments may comprise any non-transitory machine-readable media known in the art or that may be developed, whether volatile or non-volatile, including but not limited to solid state media (e.g., SRAM, DRAM, DDRAM, ROM, PROM, EPROM, flash memory, solid state drive, etc.), removable storage devices (e.g., Secure Digital (SD) card, miniSD card, microSD card, memory stick, thumb-drive, USB flash drive, ROM cartridge, Universal Media Disc), fixed drive (e.g., magnetic hard disk drive), or the like, wholly or in any combination. In some embodiments, the memory circuitry 720 is configured to store a database 770 for use by the program 760 as executed by the processing circuitry 710.

The interface circuitry 730 may be a controller hub configured to control the input and output (I/O) data paths of the computing device 110. Such I/O data paths may include data paths for exchanging signals over a communications network and data paths for exchanging signals with a user. For example, the interface circuitry 730 may comprise a transceiver configured to send and receive communication signals over one or more of a cellular network, Ethernet network, or optical network. The interface circuitry 730 may also comprise one or more of a graphics adapter, display port, video bus, touchscreen, graphical processing unit (GPU), display port, Liquid Crystal Display (LCD), and Light Emitting Diode (LED) display, for presenting visual information to a user. The interface circuitry 730 may also comprise one or more of a pointing device (e.g., a mouse, stylus, touchpad, trackball, pointing stick, joystick), touchscreen, microphone for speech input, optical sensor for optical recognition of gestures, and keyboard for text entry.

The interface circuitry 730 may be implemented as a unitary physical component, or as a plurality of physical components that are contiguously or separately arranged, any of which may be communicatively coupled to any other, or may communicate with any other via the processing circuitry 710. For example, the interface circuitry 730 may comprise output circuitry 740 (e.g., transmitter circuitry configured to send communication signals over the communications network) and input circuitry 750 (e.g., receiver circuitry configured to receive communication signals over the communications network). Similarly, the output circuitry 740 may comprise a display, whereas the input circuitry 750 may comprise a keyboard. Other examples, permutations, and arrangements of the above and their equivalents will be readily apparent to those of ordinary skill.

According to embodiments of the present disclosure, the processing circuitry 710 is configured to select a floor plan 300 from a plurality of floor plans based on where different types of room objects are positioned by a user within an interactive workspace 250 and how many of each different type of room object is included by the user within the interactive workspace 250. The processing circuitry 710 is further configured to output the selected floor plan 300 to an output interface of the computing device via the interface circuitry 730.

Given the above, aspects of the present disclosure may be implemented entirely as hardware units, entirely as software modules (including firmware, resident software, microcode, etc.), or as a combination of hardware units and software modules. For example, embodiments of the present disclosure may take the form of a non-transitory computer readable medium storing software instructions in the form of a computer program that, when executed on a programmable device, configures the programmable device to execute the various methods described below.

Particular embodiments of the present disclosure may include a plurality of complementary computing devices 100a, 100b connected to each other via a network 105, as shown in FIG. 7. According to the example network environment 900 of FIG. 7, computing device 100a is a server device, and computing device 100b is a client device. The client and server devices are both communicatively connected to, and exchange signals with each other via, the network 105.

Typical examples of the server device include a web server and/or server cluster. Other examples of the server device include (but are not limited to) a personal computer, a laptop computer, a desktop computer, a workstation, network attached storage, and/or a storage area network.

Typical examples of the client device include (but are not limited to) a personal computer, a laptop computer, a desktop computer, a workstation, a smartphone, a tablet computer, a wearable computer, and/or a smart appliance.

The network 105 includes one or more physical devices and/or signaling mediums capable of exchanging communication signals with the computing devices 100a, 100b. Examples of such a network 105 include (but are not limited to) one or more of: the Internet (or a portion thereof); one or more local area networks; one or more wireless networks; one or more cellular networks; one or more Internet Protocol-based networks; one or more Ethernet networks; one or more optical networks; and/or one or more circuit switched networks. Such a network 105 may comprise any number of networking devices such as routers, gateways, switches, hubs, firewalls, and the like (not shown) supporting the exchange of such communication signals.

According to particular embodiments, the client device may be configured to request web pages from the server device, and the server device may respond with a web page that comprises one or more of the user interfaces 200 discussed above. Such a user may then, for example, position room objects within a workspace 250 of the user interface 200 to specify search criteria that represent plan requirements that the server device uses to search a database 770 of plans for a plan 300 that meets the user's needs. The server device may then output that plan to an output interface, e.g., so that the user may make use of the result. For example, the server may respond with a new web page (or update the previous page) to present the selected plan 300 on a display of the client device and/or update search results in a search results area 280. Additionally or alternatively, the plan may be sent via email and/or sent to a printer, among other things.

The present embodiments may, of course, be carried out in other ways than those specifically set forth herein without departing from essential characteristics of the disclosure. The terminology used herein is for the purpose of describing particular aspects only and is not intended to be limiting of the disclosure.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

To the extent that "one of" a conjunctive list of items (e.g., "one of A and B") is discussed, the present disclosure refers to one (but not both) of the items in the list (e.g., an A or a B, but not both A and B). Such a phrase does not refer to one of each of the list items (e.g., one A and one B), nor does such a phrase refer to only one of a single item in the list (e.g., only one A, or only one B). Similarly, to the extent that "at least one of" a conjunctive list of items is discussed (and similarly for "one or more of" such a list), the present disclosure refers to any item in the list or any combination of the items in the list (e.g., an A only, a B only, or both an A and a B). Such a phrase does not refer to at least one of each of the items in the list (e.g., at least one of A and at least one of B).

The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The aspects of the disclosure herein were chosen and described in order to best explain the principles of the disclosure and the practical application, and to enable others of ordinary skill in the art to understand the disclosure with various modifications as are suited to the particular use or uses contemplated.

The present embodiments (including those detailed above, illustrated in the drawings, and recited by the claims below) are to be considered in all respects as illustrative and not restrictive. All changes coming within the meaning and equivalency range of the present embodiments are intended to be embraced unless otherwise specified. Although steps of various processes or methods described herein may be shown and described as being in sequential or temporal order, the steps of any such processes or methods are not limited to being carried out in any particular sequence or order, absent an indication otherwise. Indeed, the steps in such processes or methods generally may be carried out in various different sequences and orders while still falling within the scope of the embodiments disclosed herein.

The invention claimed is:

1. A method of searching floor plans, implemented by a computing device, the method comprising:
outputting, to an output interface of the computing device, an interactive workspace in which a user is enabled to individually specify, for each of one or more room objects:
a position of the room object within the interactive workspace; and
a type of room object from a plurality of room object types, each of the room object types being selectable by the user within the interactive workspace as an option for the room object;
receiving, for each of a plurality of room objects, respective user input indicating the type and position of the room object within the interactive workspace, wherein at least two of the room objects are of different types;
searching a database comprising a plurality of floor plans using, as a search criteria, where the room objects are individually positioned by the user within the interactive workspace and how many of each type of room object is included by the user within the interactive workspace to select a floor plan from the plurality of floor plans;
outputting the floor plan to the output interface of the computing device.

2. The method of claim 1, wherein searching the database to select the floor plan comprises filtering the plurality of floor plans in the database to exclude floor plans that lack, for each of the different types in the interactive workspace, a same number of rooms of the type.

3. The method of claim 1, wherein searching the database to select the floor plan comprises selecting the floor plan based on a relative position of each of the room objects to each of the other room objects.

4. The method of claim 1, further comprising:
mapping where the room objects are positioned by the user within the interactive workspace to respective first positions of a grid;
mapping rooms of the floor plan to respective second positions of the grid;
wherein searching the database to select the floor plan comprises selecting the floor plan based on a correspondence between at least one first position and at least one second position.

5. The method of claim 4, wherein selecting the floor plan is further based on each first position being collocated with at least one second position that is mapped to a room of the floor plan of the same type as the room object within the interactive workspace mapped to the first position.

6. The method of claim 5, wherein selecting the floor plan based on each at least one first position being collocated with at least one second position comprises determining that each at least one first position is the same as at least one second position.

7. The method of claim 4, wherein mapping the rooms of the floor plan to respective second positions of the grid comprises mapping a type of each room to coordinates of the grid, the method further comprising storing the mapping as a metadata representation of the floor plan in the database.

8. The method of claim 4, wherein:
selecting the floor plan is responsive to updating the mappings using progressively more coarse grids until the correspondence between the at least one first position and the at least one second position is detected using the grid;
outputting the floor plan to the output interface of the computing device comprises adding the floor plan to a list of search results provided to the user.

9. The method of claim 4, further comprising:
responsive to selecting and outputting the floor plan, updating the mappings using a finer grid than the grid such that the correspondence between the at least one first position and the at least one second position is lost;
filtering the floor plan from a list of search results provided to the user responsive to the correspondence being lost.

10. A computing device comprising:
interface circuitry and processing circuitry communicatively connected to the interface circuitry, the processing circuitry configured to:
output, via the interface circuitry, an interactive workspace in which a user is enabled to individually specify, for each of one or more room objects:
a position of the room object within the interactive workspace; and
a type of room object from a plurality of room object types, each of the room object types being selectable by the user within the interactive workspace as an option for the room object;

receive, for each of a plurality of room objects and via the interface circuitry, respective user input indicating the type and position of the room object within the interactive workspace, wherein at least two of the room objects are of different types;

search a database comprising a plurality of floor plans using, as a search criteria, where the different types of room objects are individually positioned by the user within the interactive workspace and how many of each different type of room object is included by the user within the interactive workspace to select a floor plan from the plurality of floor plans;

output the floor plan via the interface circuitry.

11. The computing device of claim 10, wherein to search the database to select the floor plan, the processing circuitry is configured to filter the plurality of floor plans in the database to exclude floor plans that lack, for each of the different types in the interactive workspace, a same number of rooms of the type.

12. The computing device of claim 10, wherein to search the database to select the floor plan, the processing circuitry is configured to select the floor plan based on a relative position of each of the room objects to each of the other room objects.

13. The computing device of claim 10, wherein the processing circuitry is further configured to:
map where the room objects are positioned by the user within the interactive workspace to respective first positions of a grid;
map rooms of the floor plan to respective second positions of the grid;
wherein to search the database to select the floor plan, the processing circuitry is configured to select the floor plan based on a correspondence between at least one first position and at least one second position.

14. The computing device of claim 13, wherein the processing circuitry is configured to select the floor plan further based on each first position being collocated with at least one second position that is mapped to a room of the floor plan of the same type as the room object within the interactive workspace mapped to the first position.

15. The computing device of claim 14, wherein to select the floor plan based on each at least one first position being collocated with at least one second position, the processing circuitry is configured to determine that each at least one first position is the same as at least one second position.

16. The computing device of claim 13, wherein:
to map the rooms of the floor plan to respective second positions of the grid, the processing circuitry is configured to map a type of each room to coordinates of the grid;

the processing circuitry is further configured to store the mapping as a metadata representation of the floor plan in the database.

17. The computing device of claim 13, wherein:
the processing circuitry is configured to select the floor plan responsive to updating the mappings using progressively more coarse grids until the correspondence between the at least one first position and the at least one second position is detected using the grid;
to output the floor plan via the interface circuitry, the processing circuitry is configured to add the floor plan to a list of search results provided to the user.

18. The computing device of claim 13, wherein the processing circuitry is further configured to:
responsive to selecting and outputting the floor plan, update the mappings using a finer grid than the grid such that the correspondence between the at least one first position and the at least one second position is lost;
filter the floor plan from a list of search results provided to the user responsive to the correspondence being lost.

19. A non-transitory computer readable medium storing software instructions for controlling a programmable computing device, wherein the software instructions, when run on the programmable computing device, cause the programmable computing device to:
output, to an output interface of the programmable computing device, an interactive workspace in which a user is enabled to individually specify, for each of one or more room objects:
a position of the room object within the interactive workspace; and
a type of room object from a plurality of room object types, each of the room object types being selectable by the user within the interactive workspace as an option for the room object;
receive, for each of a plurality of room objects, respective user input indicating the type and position of the room object within the interactive workspace, wherein at least two of the room objects are of different types;
search a database comprising a plurality of floor plans using, as a search criteria, where the room objects are individually positioned by the user within the interactive workspace and how many of each different type of room object is included by the user within the interactive workspace to select a floor plan from the plurality of floor plans;
output the floor plan to the output interface of the computing device.

* * * * *